United States Patent [19]

Sims

[11] Patent Number: 5,204,908
[45] Date of Patent: Apr. 20, 1993

[54] SOUND SYSTEM WITH RATE CONTROLLED, VARIABLE ATTENUATION

[75] Inventor: Travis M. Sims, Albuquerque, N. Mex.

[73] Assignee: Lectrosonics, Inc., Rio Rancho, N. Mex.

[21] Appl. No.: 588,446

[22] Filed: Sep. 26, 1990

[51] Int. Cl.⁵ .............................................. H03G 3/00
[52] U.S. Cl. .................................... 381/104; 381/92; 381/109; 381/119
[58] Field of Search ................ 84/711, 663, 627, 665; 381/61, 92, 119, 94, 104, 105, 109

[56] References Cited

U.S. PATENT DOCUMENTS

| | | |
|---|---|---|
| 3,508,007 | 4/1970 | Goodall et al. |
| 3,992,584 | 11/1976 | Dugan |
| 4,068,092 | 1/1978 | Ikoma et al. |
| 4,134,323 | 1/1979 | Markowitz ............................ 84/711 |
| 4,184,048 | 1/1980 | Alcaide |
| 4,448,074 | 5/1984 | Schmidt ................................ 381/123 |
| 4,449,238 | 5/1984 | Lee et al. ............................. 381/110 |
| 4,598,418 | 7/1986 | Griffith, Jr. et al. ................. 381/83 |
| 4,675,905 | 6/1987 | Flora et al. .......................... 381/119 |

OTHER PUBLICATIONS

Noll, FET/principles, experiments, and projects, 1975, pp. 221-223.

*Primary Examiner*—Forester W. Isen
*Attorney, Agent, or Firm*—Deborah A. Peacock; Donovan F. Duggan

[57] ABSTRACT

A multichannel sound system comprising a plurality of microphones and loudspeakers. Rate controlled, variable attenuation of the audio signal is provided as a function of loudspeaker and microphone proximity. The use of optical isolators or analog switches with RC delay circuits to control the rate of attenuation eliminates objectionable switching transients. Selective attenuation of loudspeakers in proximity to active microphones eliminates audio feedback.

13 Claims, 4 Drawing Sheets

SOUND SYSTEM WITH RATE CONTROLLED, VARIABLE ATTENUATION

BACKGROUND OF THE INVENTION

1. Field of the Invention (Technical Field)

The invention relates to a multichannel sound system comprising multiple microphones and multiple loudspeakers, and a method for its use.

2. Description of the Related Art Including Information Disclosed under 37 C.F.R. §§1.97-1.99 (Background Art)

A sound system comprising multiple microphones and multiple speakers typically finds use in conference rooms, meeting rooms council chambers, and the like. Normally, such confined acoustic spaces result in microphones being in close proximity to loudspeakers. This proximity either requires an unacceptably low sound system gain, or results in unwanted audio feedback if gain is increased. Accordingly, it is desirable to automatically and gradually attenuate loudspeakers near active microphones to limit unwanted audio feedback. Automatic rate controlled loudspeaker attenuation is also desirable to provide more natural and pleasing sound reinforcement to those seated near the active microphones.

U.S. Pat. No. 3,508,007, to Goodall, et al., entitled *Conference Switch for a Multiple Channel Digital Telephone System*, discloses a conference sound system wherein only a single digital signal source having a predetermined amplitude is communicated. Other signal sources are totally inhibited, not attenuated.

U.S. Pat. No. 3,992,584, to Dugan, entitled *Automatic Microphone Mixer*, discloses a sound system wherein input signals in each channel are attenuated by the ratio that the input signal in that channel bears to the sum of all input signals in all channels. Attenuation is without regard for proximity of the input signal source to loudspeakers.

U.S. Pat. No. 4,068,092, to Ikoma, et al., entitled *Voice Control Circuit*, discloses a sound system wherein voice signals are attenuated according to constant amplitude noise content. No consideration is accorded microphone and loudspeaker proximity.

U.S. Pat. No. 4,184,048, to Alcaide, entitled *System of Audioconference by Telephone Link Up*, discloses a system wherein priority is accorded the first active signal source, regardless of amplitude, while inhibiting remaining signal sources. Signal sources are symmetrically arranged about a loudspeaker; only signal components resulting from acoustical coupling between loudspeaker and opposing signal sources are canceled.

U.S. Pat. No. 4,449,238, to Lee, et al., entitled *Voice-Actuated Switching System*, teaches a computer based sound system wherein a microphone with the greatest output level is "selected" while all others are either attenuated or off. No consideration is accorded proximity of microphone and loudspeakers.

Perhaps most relevant is U.S. Pat. No. 4,598,418, to Griffith, Jr., et al., entitled *Sound System Employing Automatic Proportional Amplification*. Although three fixed attenuation levels for each speaker are disclosed, they are not necessarily optimum for any given application. Further, switching between attenuation levels is virtually instantaneous, resulting in undesirable "clicking" in the system. Lastly, this system can be programmed only by pre-selection of circuit component parameters and "hardwiring;" field programming is rendered cumbersome and difficult.

Lacking in the prior art is a sound system wherein specific speakers may be variably and gradually attenuated depending upon speaker location. The prior art further fails to disclose sound systems that prevent unwanted audio feedback by rate controlled attenuation of selected speakers.

SUMMARY OF THE INVENTION (DISCLOSURE OF THE INVENTION)

The preferred embodiment of the invention comprises a multichannel sound system. An automatic mixer provides an audio signal which is amplified by an input amplifier. A logic input buffer provides logic signals to a plurality of logic control networks, which provide logic control signals. The logic control signals and the audio signal are received by a plurality of rate controlled, variable attenuation networks. The rate controlled, variable attenuation networks selectively and gradually attenuate the audio signals. A plurality of power amplifiers receive and amplify the selectively and gradually attenuated audio signal. A plurality of loudspeakers are connected to the plurality of power amplifiers.

In the preferred embodiment, each rate controlled, variable attenuation network comprises a plurality of optical isolators.

In an alternative embodiment, each rate controlled, variable attenuation network comprises a plurality of analog switches, resistance capacitor (RC) networks, and voltage controlled amplifiers (VCA).

The invention also comprises a method for using a single channel of a multichannel sound system comprising the steps of:

1) providing an audio signal;
2) providing a logic signal associated with the audio signal;
3) amplifying and coupling the audio signal to a rate controlled, variable attenuation network;
4) amplifying and coupling the logic signal to a logic control network;
5) selectively providing a logic control signal from the logic control network to the rate controlled, variable attenuation network;
6) controlling the amount of attenuation of the audio signal by the logic control signal;
7) controlling the rate at which the audio signal is switched between attenuation levels; and
8) coupling the audio signal to audio output apparatus.

The preferred embodiment of the invention further comprises the step of selectively energizing optical isolator. The preferred method of using the invention further comprises the steps of amplifying the power of the audio signal, and coupling the audio signal to audio output apparatus.

The alternative embodiment of the invention further comprises the step of selectively energizing analog switches and RC networks, thereby controlling the attenuation and rate of attenuation of a voltage controlled amplifier. The alternative method of using the invention further comprises the steps of amplifying the voltage of the audio signal, amplifying the power of the audio signal, and coupling the audio signal to audio output apparatus.

It is a primary object of the invention to provide a sound system comprising a plurality of variable attenuation levels for each loud speaker.

It is a further object of the invention to eliminate objectionable signal transients (clicking) by rate controlled switching between attenuation levels.

Yet another object of the invention is to provide a reliable sound system amenable to field programming and adjustment.

Still another object of the invention is selective attenuation of the audio output signal based upon specific microphone-loudspeaker proximity.

One advantage of the present invention is the provision of loudspeaker attenuation based upon proximity to active sound sources.

Yet another advantage of the present invention is the ease with which relatively unskilled personnel can adjust and maintain the system.

Still another advantage of the present invention is the improvement in sound quality provided by transient-free switching and elimination of unwanted audio feedback.

Other objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several embodiments of the present invention and, together with the description, serve to explain the principles of the invention. The drawings are only for the purpose of illustrating a preferred embodiment of the invention and are not to be construed as limiting the invention.

In the figures.

DETAILED DESCRIPTION OF THE PREFERRED EMBODIMENTS OF THE INVENTION (BEST MODES FOR CARRYING OUT THE INVENTION)

Figure 1:
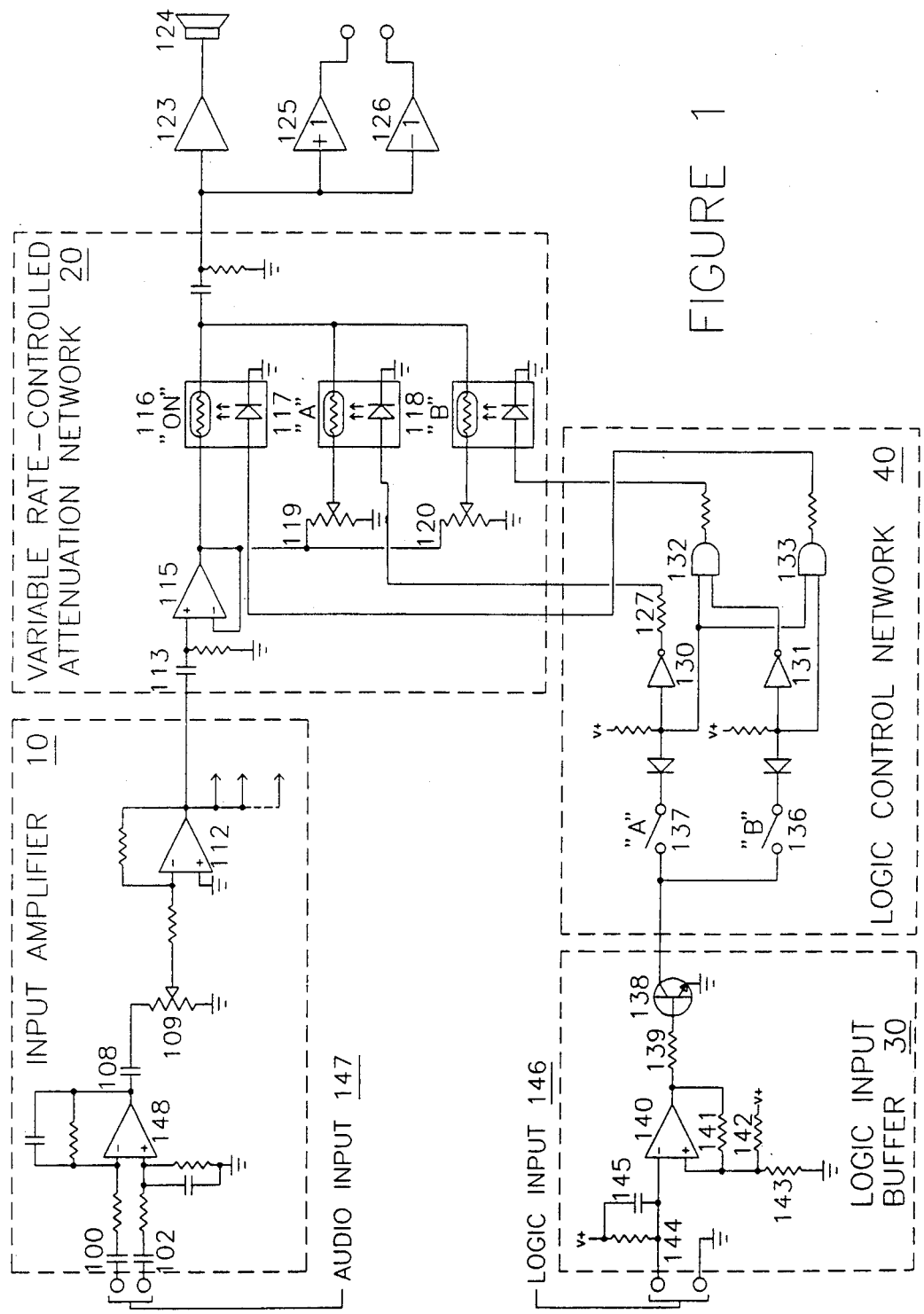
FIG. 1 is a detailed schematic diagram of a single channel of the preferred embodiment of the invention.
Figure 2:
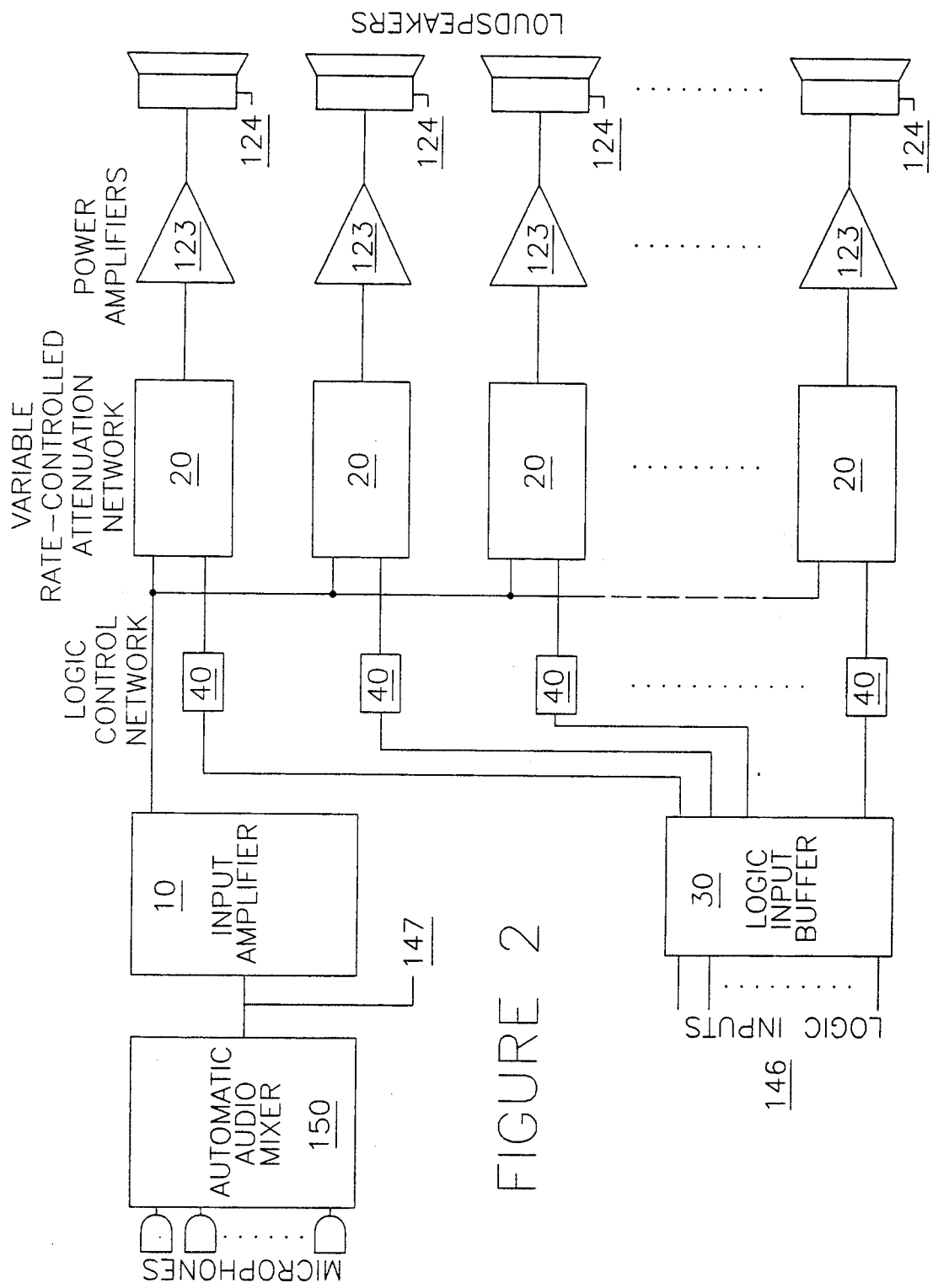
FIG. 2 is a simplified block diagram of a multichannel sound system of the invention.

Reference is now made to FIGS. 1-3(b) which show the preferred sound system of the invention. As seen specifically in FIG. 1, input amplifier 10 receives audio input signal 147. Audio input signal 147 may originate from a microphone, video recorder, tape recorder, or a plurality of sources through an automatic mixer 150, as shown in FIG. 2. Input signal 147 enters input amplifier 10 differentially through blocking capacitors 100 and 102, and is buffered and converted to a single ended signal by conventional operational amplifier 148. Operational amplifier 148 may comprise, for example, a Texas Instruments TL072 operational amplifier, although other amplifiers common to the art may also be used.

The output of operational amplifier 148 is coupled through capacitor 108 to potentiometer 109. Potentiometer 109 serves as the acoustic level control for the entire system. The audio input signal is further buffered by operational amplifier 112; and may drive as many channels as needed within the capability of the amplifier. The simplified block diagram of FIG. 2 illustrates schematically the connection of a plurality of channels to input amplifier 10. Each channel comprises a logic control network 40, a rate controlled variable attenuation network 20, a power amplifier 123, and at least one loudspeaker 124.

The audio signal is coupled through capacitor 113 and operational amplifier 115 to one or more rate controlled, variable attenuation networks 20. Each attenuation network 20 comprises three signal paths simultaneously driven by operational amplifier 115. Each signal path, in turn, comprises at least one optical isolator 116 117, and 118. The optical isolators 116 117, and 118 each further comprise a light emitting diode (LED) and a light dependent resistor, and may, for example, comprise a Clairex TM CLM-50, manufactured by Clairex, although other optical isolators may be used.

Optical isolator 116 provides an unattenuated audio signal route Potentiometer 119 and optical isolator 117 provide "A" level attenuation routing, while potentiometer 120 and optical isolator 118 provide "B" level attenuation. Potentiometer 119 and 120 provide continuously variable selection of attenuation, from no attenuation to fully off. "A" level attenuation potentiometer 119, however, is normally set for greater attenuation (resistance) than "B" level attenuation potentiometer 120. Potentiometers 119 and 120 provide the capability of tailoring each audio channel to the requirements of the acoustic space.

Optical isolators 116, 117, and 118 provide signal routing in accordance with control signals from logic control network 40. Signal routing is accomplished by energizing the LED element in the optical isolator associated with the appropriate attenuation level. An unattenuated audio signal would require energization of optical isolator 116. In like manner, "A" level attenuation requires energization of optical isolator 117, while "B" level attenuation is provided by energization of optical isolator 118.

Figure 3:
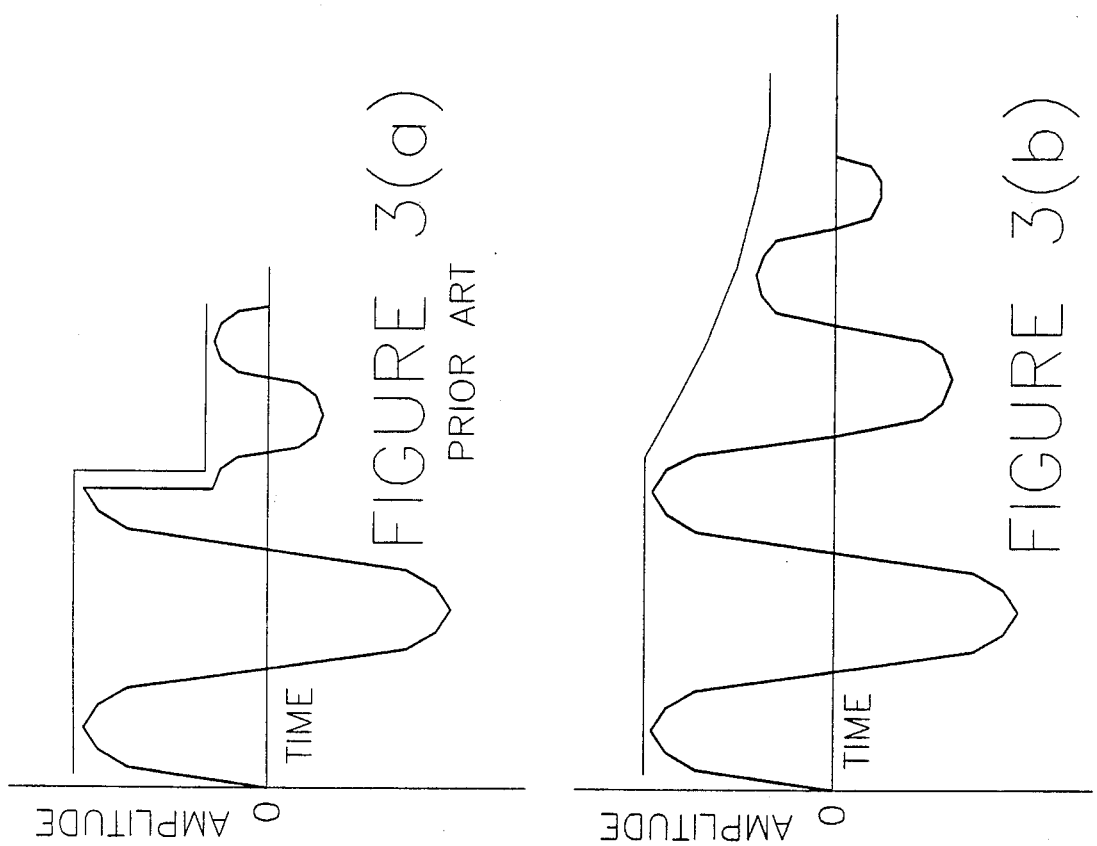
FIG. 3(a) is a graph depicting instantaneous switching, which produces audible transients.
FIG. 3(b) is a graph depicting rate controlled switching, which does not produce audible transients.

In the preferred embodiment, the energization of any given LED and its associated light dependent resistor exhibits a finite exponential time constant of several milliseconds. This built-in control of the rate-of-change of the attenuation prevents the objectionable audio transient, or "clicking," associated with abruptly changing signal levels. Reference to FIG. 3 graphically reveals the sharp contrast between the unwanted signal transients caused by instantaneous switching in the prior art, such as shown in FIG. 3(a), and the rate controlled switching of the present invention, depicted in FIG. 3(b). Rate controlled switching, by eliminating transients, provides a more pleasing and coherent audio output.

Optical isolators 116, 117, and 118 are energized in accordance with control signals provided by logic control network 40. Initially, logic input signals, associated with active microphones or other sources, are provided to logic input buffer 30. The logic input signals may comprise signals resulting from transistor-transistor logic (TTL) type digital inputs, contact closures, or electronic switches. Assuming V+ =5V, a logic input signal at 146 results in a change of voltage from V+ to 0V at the negative terminal of operational amplifier 140. Capacitor 145 charges to a voltage equal to V+. Since the voltage at the positive terminal of operational amplifier 140 is about 1.67V, the output of operational amplifier 140 switches from 0V to 5V. The voltage at the positive terminal of operational amplifier 140 then becomes 3.33V. Resistors 141, 142, and 143 determine the voltages at the positive terminal of operational amplifier 140.

The 5V output of operational amplifier 140 turns on transistor 138 through resistor 139. Upon cessation of the logic input signal, capacitor 145 discharges through resistor 144, increasing the voltage at the negative terminal of operational amplifier to 3.33V. Output from operational amplifier 140 ceases, turning off transistor 138.

The collector of transistor 138 is connected to one or more logic control networks 40. Each logic control network has one or more "A" and "B" level attenuation switches. In the preferred embodiment, each channel has one set of "A" level attenuation switches and one set of "B" level attenuation switches. The actual number of switches corresponds to the number of logic input buffer networks 30 in the system. This provides ease of field programming, as each channel may respond with either "A" or "B" level attenuation, or no attenuation to a logic input signal.

Two complementary metal oxide semiconductor (CMOS) inverters 130 and 131, such as a Motorola ® MC74HC04, and two CMOS AND gates 132 and 133, such as a Motorola ® MC74HC08, form the priority logic control. These gates implement the following truth table:

| A | B | RESULTING ACTION |
|---|---|---|
| 0 | 0 | No attenuation (output of AND gate 133 high) |
| 0 | 1 | "B" level attenuation (output of AND gate 132 high) |
| 1 | 0 | "A" level attenuation (output of inverter 130 high) |
| 1 | 1 | "A" level attenuation (output of inverter 130 high) |

The "A" level attenuation signal is asserted (active low) when switch 137 is closed and transistor 138 has been rendered conductive by a logic input signal. When transistor 138 is conductive, a logic low level is applied to inverter 130. A logic low input to inverter 130 produces a logic high output, which, in turn, energizes the LED element of optical isolator 117 through resistor 127. The audio signal from operational amplifier 115 is scaled down in potentiometer 119 and passed to power amplifier 123 and line drivers 125 and 126. "B" level attenuation occurs in a similar manner. If switch 136 is closed, the output of transistor 138 provides a logic low input to inverter 131. The logic high output of inverter 131 produces a logic high from AND gate 132, energizing optical isolator 118. The audio signal is attenuated in potentiometer 120 and passed to power amplifier 123 and line drivers 125 and 126.

When neither "A" nor "B" level attenuation is asserted, AND gate 133 outputs a logic high, energizing optical isolator 118. This action transfers the audio signal unattenuated to power amplifier 123 and line drivers 125 and 126. Power amplifier 123 is connected to at least one loudspeaker.

It should be noted that "A" level attenuation takes precedence over "B" level attenuation. As noted previously, "A" level potentiometer 119 is set for higher resistance (and greater attenuation) than "B" level potentiometer 118. Thus, if more than one logic input is simultaneously active, and, further, if one active logic input asserts "A" level attenuation and another active logic input asserts "B" level attenuation, both on the same channel, the channel will maintain "A" level attenuation. The system bias towards greater attenuation insures elimination of undesirable audio feedback.

Figure 4:
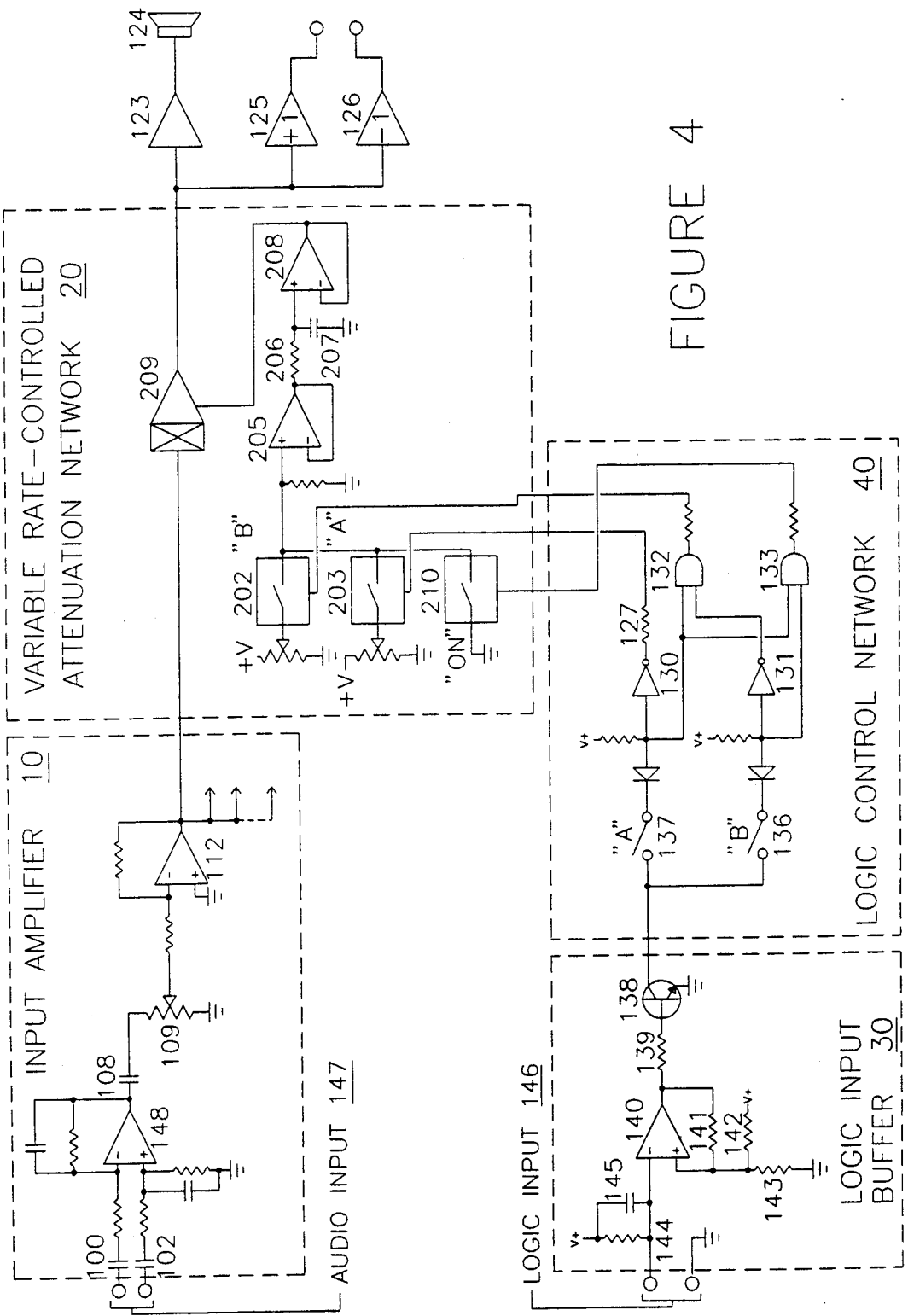
FIG. 4 is a detailed schematic diagram of a single channel of an alternative embodiment of the invention.

FIG. 4 depicts an alternative embodiment of the invention. All elements are identical to those in FIG. 1, with the exception of rate controlled variable attenuation network 20'. In this embodiment, logic control signals from logic control network 40 control analog switches 202, 203, and 210. Closure of analog switch 203 corresponds to "A" level attenuation, closure of analog switch 202 corresponds to "B" level attenuation, while closure of analog switch 210 results in no attenuation. Voltages from the analog switches (0 volts in the case of analog switch 210) are buffered by operational amplifier 205, then exponentially ramped by the RC network constituted by resistor 206 and capacitor 207. This RC network serves as the rate controlling element of the alternative embodiment of the invention.

The rate control signal is buffered by operational amplifier 208 and supplied to the control port of voltage controlled amplifier 209. Resulting amplification of the audio signal from operational amplifier 112 is proportional to the rate control signal received at the control port of voltage controlled amplifier 209. As in the preferred embodiment, the resultant audio signal drives power amplifier 123 and line drivers 125 and 126.

An example of the utility of the invention may be found in a conference room with microphones at each seat, and overhead loudspeakers. If an active microphone were located between two loudspeakers, those loudspeakers would preferably be "A" level attenuated to a very low level. Commensurately, loudspeakers at a greater distance from the active microphone would be "B" level attenuated. Loudspeakers at the maximum distance from the active microphone would be unattenuated.

An example of the advantages provided by the improved sound system occurs when one microphone is active and another microphone simultaneously becomes active. Listeners close to loudspeakers attenuated by the second active microphone will be aware only of a gradual diminution of volume and not an objectionable "click" or other unwanted audio feedback.

Although the invention has been described with reference to these preferred embodiments, other embodiments can achieve the same results. Variations and modifications of the present invention will be obvious to those skilled in the art and it is intended to cover in the appended claims all such modifications and equivalents.

What is claimed is:

1. A multichannel sound system comprising:
    means for automatically mixing a plurality of microphone outputs and providing an audio signal;
    means for providing a logic signal indicative of activation of at least one of said plurality of microphone outputs;
    means for amplifying and coupling said audio signal to rate controlled, variable attenuation network means;

means for amplifying and coupling said logic signal to logic control network means;

means for selectively providing a logic control signal from said logic control network means to said rate controlled, variable attenuation network means;

means of selectively and variably controlling the rate of attenuation of said audio signal;

means for coupling said audio signal to audio output means; and wherein said means for providing a logic further comprises logic input means corresponding to the number of individual microphone channels, operational amplifier means, and transistor means, and said logic control network means further comprises at least two attenuation switches, inverter means, and AND gate means.

2. The invention of claim 1 wherein the means for controlling the rate of attenuation of the audio signal comprises optical isolator means.

3. The invention of claim 1 wherein the means of controlling the rate of attenuation of the audio signal comprises analog switch and RC network means.

4. The invention of claim 3 wherein the means of controlling the rate of attenuation additionally comprises voltage controlled amplifier means.

5. The invention of claim 1 wherein said audio output means comprises power amplifier means, loudspeaker means and line driver means.

6. A method of using a multichannel sound system comprising the steps of:

providing an audio signal;

providing a logic signal which indicated the presence or absence of the audio signal;

amplifying and coupling the audio signal to rate controlled, variable attenuation network means;

amplifying and coupling the logic signal to logic control network means;

selectively providing a logic control signal from the logic control network means to a rate controlled, variable attenuation network means;

selectively and variably controlling attenuation of the audio signal;

coupling the audio signal to audio output means; and wherein the steps of providing a logic signal further comprise the step of providing a logic input corresponding to the number of individual microphone channels, an operational amplifier and a transistor, and wherein the step of amplifying and coupling the logic signal to a logic control network means further comprises the step of providing at least two attenuation switches, an inverter and AND gates.

7. The invention of claim 6 wherein the step of controlling attenuation and the rate of attenuation of the audio signal comprises the additional step of selectively energizing optical isolator means.

8. The invention of claim 6 wherein the step of controlling attenuation and the rate of attenuation of the audio signal comprises the additional step of selectively energizing an analog switch and RC network means.

9. The invention of claim 8 wherein the step of controlling attenuation and the rate of attenuation of the audio signal comprises the additional step of amplifying the voltage of the audio signal.

10. The invention of claim 8 wherein the step of coupling the audio signal to audio output means comprises the additional steps of amplifying the power of the audio signal, connecting at least one loudspeaker means and connecting at least one line drive means.

11. A multichannel sound system comprising:

automatic mixer means for automatically mixing a plurality of microphone outputs and providing an audio signal;

input amplifier means for amplifying the audio signal;

logic input buffer means for providing logic signals;

a plurality of logic control network means for receiving the logic signals and providing logic control signals;

a plurality of rate controlled, variable attenuation means for receiving the audio signal and the logic control signals, and selectively and gradually attenuating the audio signals;

a plurality of power amplifier means connected to the rate controlled, variable attenuation network means for receiving and amplifying the selectively and gradually attenuated audio signals;

a plurality of loudspeaker means connected to the plurality of power amplifier means; and wherein said logic input buffer means further comprises logic input means corresponding to the number of said microphone outputs, operational amplifier means and transistor means, and said logic control network means further comprises at least two attenuation switches, inverter means, and AND gate means.

12. The invention of claim 11 wherein each rate controlled network means comprises a plurality of optical isolator means.

13. The invention of claim 11 wherein each rate controlled network means comprises analog switch and RC network means.

* * * * *